(12) United States Patent
Light et al.

(10) Patent No.: US 10,998,224 B2
(45) Date of Patent: May 4, 2021

(54) SEMICONDUCTOR DEVICES COMPRISING CONDUCTIVE PATTERNS OF VARYING DIMENSIONS AND RELATED SYSTEMS

(71) Applicant: Micron Technology, Inc., Boise, ID (US)

(72) Inventors: Scott L. Light, Boise, ID (US); Richard J. Hill, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/531,837

(22) Filed: Aug. 5, 2019

(65) Prior Publication Data
US 2020/0066578 A1    Feb. 27, 2020

Related U.S. Application Data

(63) Continuation of application No. 16/107,407, filed on Aug. 21, 2018, now Pat. No. 10,522,395.

(51) Int. Cl.
| | |
|---|---|
| *H01L 23/52* | (2006.01) |
| *H01L 21/768* | (2006.01) |
| *H01L 21/033* | (2006.01) |
| *H01L 23/522* | (2006.01) |
| *H01L 23/528* | (2006.01) |

(52) U.S. Cl.
CPC .... *H01L 21/76816* (2013.01); *H01L 21/0335* (2013.01); *H01L 21/0337* (2013.01); *H01L 21/0338* (2013.01); *H01L 21/76877* (2013.01); *H01L 23/528* (2013.01); *H01L 23/5226* (2013.01)

(58) Field of Classification Search
CPC ............. H01L 21/0335; H01L 21/0337; H01L 21/0338; H01L 21/76816; H01L 21/76877; H01L 23/5226; H01L 23/528
USPC ........................................................ 257/758
See application file for complete search history.

(56) References Cited

U.S. PATENT DOCUMENTS

| | | | |
|---|---|---|---|
| 8,227,354 B2 | 7/2012 | Kim et al. | |
| 8,350,344 B2 | 1/2013 | Son et al. | |
| 8,481,417 B2 | 7/2013 | Tran | |
| 8,871,646 B2 | 10/2014 | Devilliers | |
| 8,969,214 B2* | 3/2015 | Light | H01L 21/3086 438/736 |
| 9,184,159 B2 | 11/2015 | Nirromand et al. | |
| 9,213,239 B2* | 12/2015 | Light | G03F 7/0758 |
| 9,613,902 B2 | 4/2017 | Pellizzer et al. | |
| 2015/0303255 A1 | 10/2015 | Millward | |
| 2015/0325459 A1 | 11/2015 | Sandhu et al. | |

* cited by examiner

*Primary Examiner* — Luan C Thai
(74) *Attorney, Agent, or Firm* — TraskBritt

(57) ABSTRACT

A metal pattern comprising interconnected small metal segments, medium metal segments, and large metal segments. At least one of the small metal segments comprises a pitch of less than about 45 nm and the small metal segments, medium metal segments, and large metal segments are separated from one another by variable spacing. Semiconductor devices comprising initial metallizations, systems comprising the metal pattern, and methods of forming a pattern are also disclosed.

18 Claims, 19 Drawing Sheets

SEMICONDUCTOR DEVICES COMPRISING CONDUCTIVE PATTERNS OF VARYING DIMENSIONS AND RELATED SYSTEMS

CROSS-REFERENCE TO RELATED APPLICATION

This application is a continuation of U.S. patent application Ser. No. 16/107,407, filed Aug. 21, 2018, now U.S. Pat. No. 10,522,395, issued Dec. 31, 2019 the disclosure of which is hereby incorporated herein in its entirety by this reference.

TECHNICAL FIELD

Embodiments disclosed herein relate to patterns, such as conductive patterns, used in semiconductor devices and fabrication of the semiconductor devices. More particularly, embodiments of the disclosure relate to conductive patterns having a pitch of less than about 45 nm, semiconductor devices including small, medium, and large conductive segments where the small conductive segments have a pitch of less than about 45 nm, systems including the conductive patterns, and methods of forming the patterns.

BACKGROUND

Semiconductor devices including metal features are difficult to scale down to smaller pitch sizes. As components of semiconductor devices continue to decrease in size, the metal features also need to be scaled down. The metal features in conventional semiconductor devices include a pattern of metal lines separated from one another by spaces. Each of the metal lines may have the same width and the metal lines may be equally spaced from one another, while other metal features may vary in size and spacing. Photolithography techniques, such as immersion photolithography, are used to form the metal features. Currently, 193 nm wavelength photolithography is limited to forming metal features at a pitch of about 80 nm. To improve the resolution of 193 nm wavelength photolithography, double patterning techniques (e.g., spacer assisted double patterning (SADP)) have been used to reduce the pitch by up to one-half. Triple patterning techniques, quadruple patterning techniques (e.g., spacer assisted quadruple patterning (SAQP)), and octuplet patterning techniques have also been investigated to further scale down the pitch. While these patterning techniques may be used to form equally spaced patterns of metal lines, the patterning techniques are not effective to form metal features of variable sizes and having variable spacings between adjacent metal features. In addition, these patterning techniques are costly and require numerous process acts. Extreme ultraviolet (EUV) lithography has also been utilized to form metal features at a pitch of about 36 nm. However, the EUV lithography utilizes numerous and complex process acts and is expensive.

BRIEF DESCRIPTION OF THE DRAWINGS

FIGS. 1A, 2A, 4A-8A, 10A-14A, 16A, 17A, 19A, and 20A are cross-sectional views of a pattern during various stages of fabrication in accordance with embodiments of the disclosure;

FIGS. 1B, 2B, 4B-8B, 10B-14B, 16B, 17B, 19B, and 20B are top down views of the pattern during various stages of fabrication in accordance with embodiments of the disclosure;

DETAILED DESCRIPTION

Figure 1A:
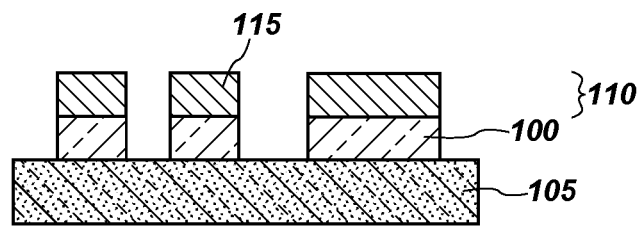

Patterns having a pitch of less than about 45 nm are disclosed, as are semiconductor devices and systems including the patterns and methods of forming the patterns. The pattern includes segments of variable (e.g., different) sizes and separated from one another by variable (e.g., unevenly spaced, unequally spaced) distances. At least one small segment of the pattern is formed at a pitch of less than about 45 nm by, for example, immersion photolithography. The pattern also includes at least one medium segment, at least one large segment, or combinations thereof, with at least some of the small segments, the medium segments, and the large segments interconnected to form the pattern. The small segments, medium segments, and metal segments are of different sizes and are unevenly spaced from one another. The pattern may also be referred to herein as a so-called "complex pattern" to distinguish from a pattern that includes evenly spaced lines. Therefore, the complex pattern according to embodiments of the disclosure does not include a pattern of lines separated by spaces, with the lines equally spaced from one another. The pattern is formed in a conductive material or in a semiconductive material, such as in a metal material or a polysilicon material.

The patterns include, for example, conductive patterns (e.g., metal patterns) having a pitch of less than about 45 nm. The conductive pattern includes conductive segments (e.g., metal segments) of variable (e.g., different) sizes and separated from one another by variable (e.g., unevenly spaced, unequally spaced) distances. At least one small conductive segment of the conductive pattern is formed at a pitch of less than about 45 nm by, for example, immersion photolithography. The conductive pattern also includes at least one medium conductive segment, at least one large conductive segment, or combinations thereof, with at least some of the small conductive segments, the medium conductive segments, and the large conductive segments interconnected to form the conductive pattern. The small conductive segments, medium conductive segments, and large conductive segments are of different sizes and are unevenly spaced from one another. The conductive pattern may also be referred to herein as a so-called "complex conductive pattern" or "complex metal pattern" to distinguish from a conductive (e.g., metal pattern) that includes evenly spaced conductive or metal lines. Therefore, the complex conductive pattern according to embodiments of the disclosure does not include a pattern of conductive lines separated by spaces, with the conductive lines equally spaced from one another.

The pattern, such as the conductive pattern (e.g., the metal pattern), is formed by conducting multiple photolithography acts, multiple spacer deposition and etch acts, multiple hardmask removal acts, and a planarization act. The process enables the metal segments of different (e.g., nonuniform, variable) sizes and spacings to be formed by using the photolithography acts, the spacer deposition and etch acts, the hardmask removal acts, and the planarization act to form hardmask portions of variable widths in a single patterned portion of a multi-portion hardmask. The hardmask portions substantially correspond in size (e.g., width) to the size (e.g., width) of the metal segments ultimately to be formed. The photolithography acts include photolithography acts conducted at a resolution limit of the photolithography technique to form the small metal segments and photolithography acts conducted using a so-called "chop mask" to form the medium metal segments and large metal segments. The chop masks are used to cover (e.g., protect) a majority of previously formed materials, except for in locations where the medium metal segments and large metal segments are ultimately to be formed. While embodiments of the disclosure refer to metal patterns, patterns in other materials may also be formed.

By utilizing immersion photolithography and the above-mentioned acts, the small metal segments of the metal pattern may be formed at a pitch of less than about 45 nm, such as less than about 40 nm, less than about 35 nm, less than about 30 nm, or less than about 25 nm. In some embodiments, the pitch ranges from about 20 nm to about 25 nm. Therefore, the small metal segments may be formed without using EUV photolithography, reducing the cost associated with forming the metal pattern. The medium metal segments of the metal pattern may be formed by pitch multiplication (e.g., pitch doubling, pitch quadrupling) techniques and using a chop mask. The large metal segments of the metal pattern may be formed by covering the hardmask portions corresponding in size to the small and medium metal segments with another chop mask and forming the large metal segments in areas not covered by the chop mask.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor device or a complete process flow for manufacturing the semiconductor device and the structures described below do not form a complete semiconductor device. Only those process acts and structures necessary to understand the embodiments described herein are described in detail below. Additional acts to form a complete semiconductor device may be performed by conventional techniques.

The materials described herein may be formed by conventional techniques including, but not limited to, spin coating, blanket coating, chemical vapor deposition (CVD), atomic layer deposition (ALD), plasma enhanced ALD, or physical vapor deposition (PVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may include rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the term "pitch" refers to the distance between identical points in two adjacent (i.e., neighboring) features.

As used herein, the term "selectively etchable" means and includes a material that exhibits a greater etch rate responsive to exposure to a given etch chemistry relative to another material exposed to the same etch chemistry. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "semiconductor device" includes, without limitation, a memory device, as well as other semiconductor devices which may or may not incorporate memory, such as a logic device, a processor device, or a radiofrequency (RF) device. Further, a semiconductor device may incorporate memory in addition to other functions such as, for example, a so-called "system on a chip" (SoC) including a processor and memory, or a semiconductor device including logic and memory.

As used herein, the relative terms "small," "smaller," "medium," "large," or "larger" are used to refer to relative differences in size (e.g., width) between different features.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOT") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

Figure 1B:
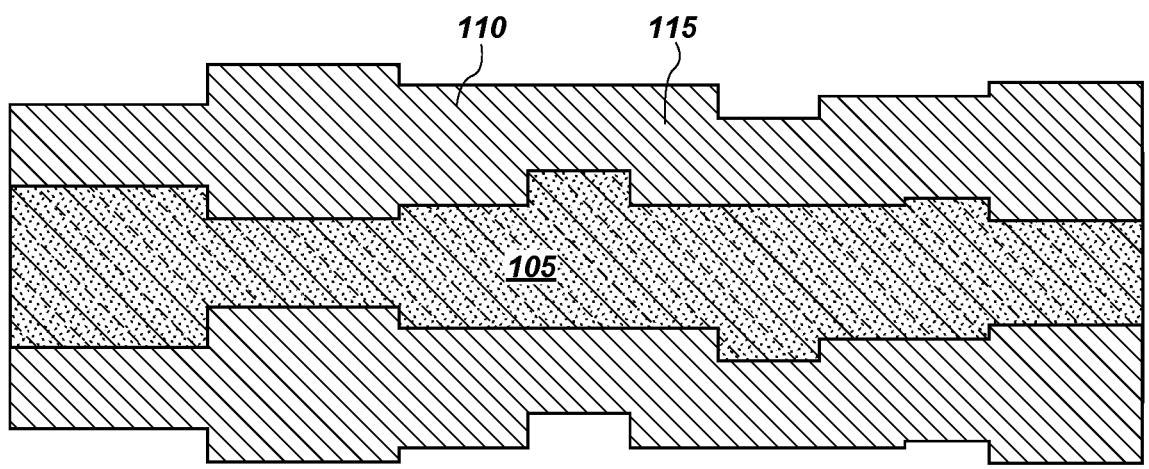

To form the metal pattern according to embodiments of the disclosure, a first photolithography act is conducted to form mandrels over a hardmask material on another material, which may comprise a substrate or another material over a substrate. To form mandrels 100, a first photoresist material is formed over a mandrel material, which is formed over a hardmask material 105, as shown in FIGS. 1A and 1B. The first photoresist material is formed over the mandrel material by conventional techniques. The mandrel material may be formed by conventional techniques, such as by CVD or other deposition technique, over the hardmask material 105. The first photoresist material is patterned (e.g., exposed and developed) to form a first photoresist pattern 110 including first photoresist features 115, as shown in FIGS. 1A and 1B. The first photoresist material may be a conventional 193 nm photoresist, and the first photoresist pattern 110 may be formed by immersion photolithography. While embodiments of the disclosure describe that the photolithography acts are conducted by immersion photolithography, other photolithography techniques, such as EUV photolithography, may be used.

Figure 2A:
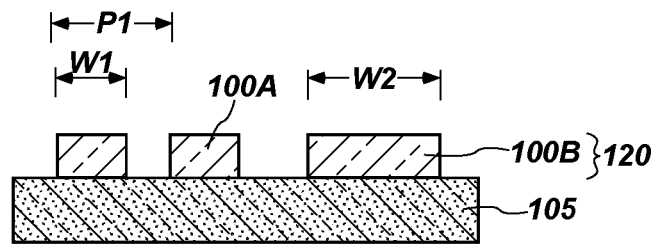
Figure 2B:
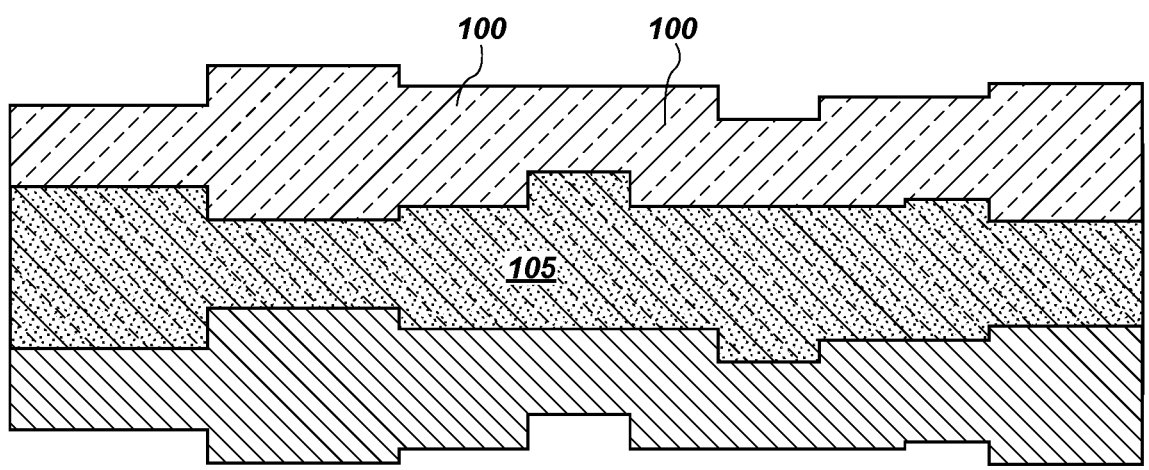

The mandrel material may be a photoresist material, a spin-on carbon material or other carbon material, an amorphous silicon material, or other material selectively etchable relative to the first photoresist material and the hardmask material 105. The carbon material may be formed by a spin-on technique, a CVD technique, or other deposition technique. The first photoresist pattern 110 is transferred to the underlying mandrel material and the first photoresist pattern 110 is removed to form a mandrel pattern 120 including the mandrels 100 on the hardmask material 105 as shown in FIGS. 2A and 2B. The transfer of the first photoresist pattern 110 to the mandrel material and the removal of the first photoresist pattern 110 is conducted by conventional techniques.

While the mandrels 100 are illustrated in FIGS. 1A and 2A as being a single material, the mandrels 100 may include multiple portions (e.g., two or more portions) with the portions formed from different materials. By way of example only, the mandrels 100 may include two portions, with the mandrel material including a silicon oxide material or a silicon oxynitride material on a carbon material, or a spin-on silicon-containing material on a spin-on carbon material. Each portion of the mandrel material may be formed of a different material or of a different composition of a single material, with each portion selectively etchable relative to an overlying material or an underlying material.

The mandrel pattern 120 is a two-dimensional (2D) pattern and includes multiple mandrels 100, with at least one of the mandrels 100 having a different size (e.g., dimension, width) than at least one other of the mandrels 100. As used herein, widths are measured in a direction that is substantially parallel to the major plane of the structure. One or more of the mandrels 100 may differ, for example, in width relative to the other mandrels 100. The mandrels 100 in the mandrel pattern 120 may exhibit two or more different widths depending on the metal pattern ultimately to be formed, with the widths of the mandrels 100 corresponding to spacings between first spacers as described below. As shown, for example, in FIGS. 2A and B, the mandrel pattern 120 may include two small mandrels 100A and one large mandrel 100B, where the width W1 of the small mandrels 100A is less than the width W2 of the large mandrel 100B. However, the mandrel pattern 120 is not limited to three mandrels 100 and may include additional small mandrels 100A, additional large mandrels 100B, or a combination thereof depending on the metal pattern ultimately to be formed. The mandrels 100 are formed at an initial pitch, P1.

The hardmask material 105 may include, but is not limited to, a carbon material, a silicon oxide material, a silicon nitride material, a metal oxide material (e.g., titanium oxide), a metal nitride material (e.g., titanium nitride), other selectively etchable material, or a combination thereof.

Figure 3:
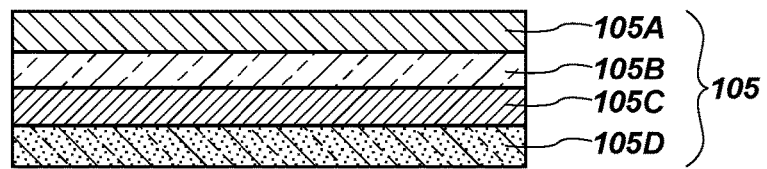
FIG. 3 is a cross-sectional view of a hardmask material used during fabrication of the pattern in accordance with embodiments of the disclosure.

While the hardmask material 105 is illustrated for convenience in FIGS. 1A and 2A as being a single material, the hardmask material 105 includes multiple portions (e.g., two or more portions), as illustrated in FIG. 3, with the portions formed from different materials. Each portion of the hardmask material 105 may be formed of a different material or of a different composition of a single material, with each portion selectively etchable relative to an overlying portion or an underlying portion of the hardmask material 105 or to another overlying material or underlying material. Therefore, the underlying material may function as a so-called "etch stop" during removal acts conducted to form the metal pattern. For instance, a first hardmask portion 105A may be selectively etchable relative to the mandrel material and to a second hardmask portion 105B, and a fourth hardmask portion 105D may be selectively etchable relative to a third hardmask portion 105C and to a material underlying the hardmask material 105, such as the substrate or a metal material. The multiple portions of the hardmask material 105 may form a hardmask stack 125.

As shown in FIG. 3, the hardmask material 105 may, for example, include four hardmask portions 105A-105D, with each hardmask portion exhibiting etch selectivity relative to its directly adjacent (e.g., directly overlying or directly underlying) material. The first hardmask portion 105A may be selectively etchable relative to the mandrel material and to the second hardmask portion 105B, the second hardmask portion 105B may be selectively etchable relative to the first hardmask portion 105A and to the third hardmask portion 105C, the third hardmask portion 105C may be selectively etchable relative to the second hardmask portion 105B and to the fourth hardmask portion 105D, and the fourth hardmask portion 105D may be selectively etchable relative to the third hardmask portion 105C and to the substrate or other underlying material. By way of example only, each of the first hardmask portion 105A and the third hardmask portion 105C may be formed of the same material, and each of the second hardmask portion 105B and the fourth hardmask portion 105D may be formed of the same material. The hardmask portions 105A-105D may be formed by conventional techniques, such as by spin-on techniques or deposition techniques. The hardmask portions 105A-105D may, for example, be formed by CVD or spin-coating.

Thicknesses of each of the hardmask portions 105A-105D in FIG. 3 and subsequent drawings are exaggerated for clarity. While FIG. 3 illustrates each of the hardmask portions 105A-105D as exhibiting the same thickness, each of the hardmask portions 105A-105D may be a different thickness depending on the difference in etch selectivities of the materials used. Each of the hardmask portions 105A-105D may be formed of a $SiO_x$ material, a SiON material, a TiN material, a SiOC material, or a spin-on carbon material. In some embodiments, the second hardmask portion 105B and the fourth hardmask portion 105D are formed from a silicon oxide material and the first hardmask portion 105A and the third hardmask portion 105C are formed from a carbon material. In other embodiments, the second hardmask portion 105B and the fourth hardmask portion 105D are formed from a carbon material and the first hardmask portion 105A and the third hardmask portion 105C are formed from a silicon oxide material.

Figure 4A:
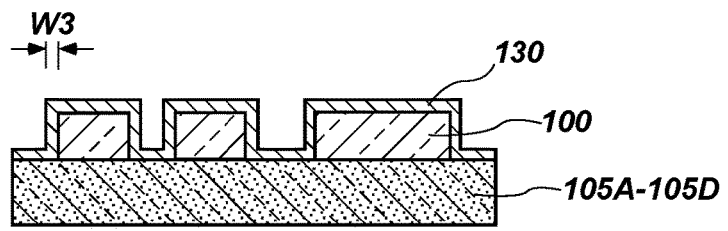
Figure 4B:
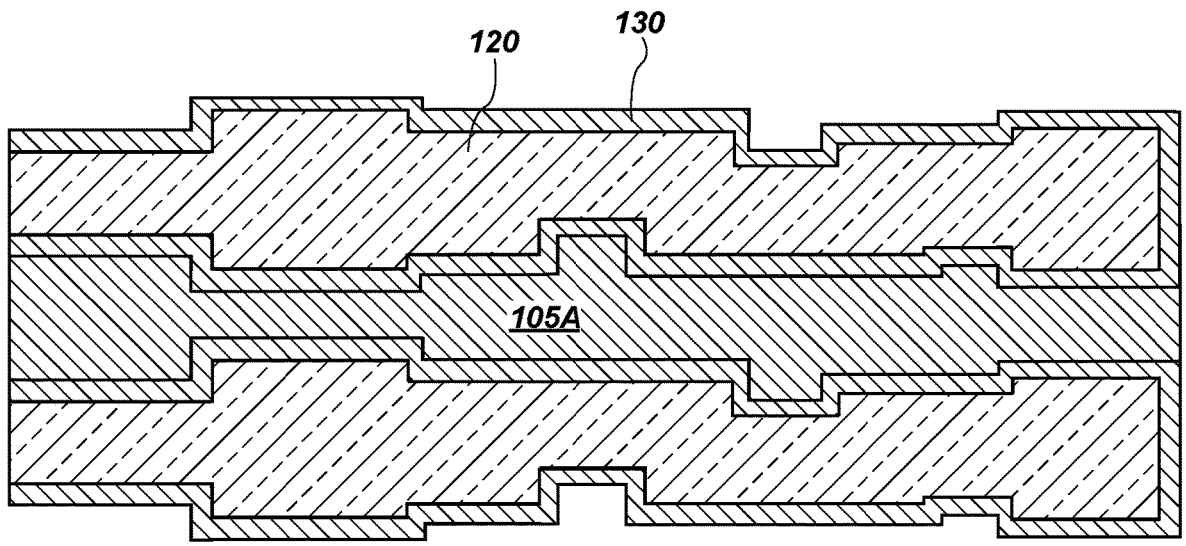

As shown in FIGS. 4A and 4B, a first spacer material 130 is formed over the mandrels 100, such as over sidewalls and a top surface of the mandrels 100 and over a top surface of the hardmask material 105 at a thickness that corresponds to a desired width W3 of first spacers as described in detail below. The first spacer material 130 may be selectively etchable relative to the mandrel material. The first spacer material 130 may include, but is not limited to, a silicon oxide material, a metal oxide material, such as a transition metal oxide (e.g., a titanium oxide, an aluminum oxide), a silicon nitride material, a carbon material, or other material that is able to be formed at the width W3 and selectively etchable relative to the mandrel material. The first spacer material 130 may be formed by conventional techniques including, but not limited to, CVD, ALD, self-assembly techniques such as grafted polymer brushes or block copolymers, etc. In some embodiments, the first spacer material 130 is conformally formed over the mandrels 100, such as by an ALD process. While the hardmask material 105 is illustrated in FIG. 4A and subsequent drawings as being formed from a single material, the hardmask material 105 includes hardmask portions 105A-105D as described above.

Figure 5A:
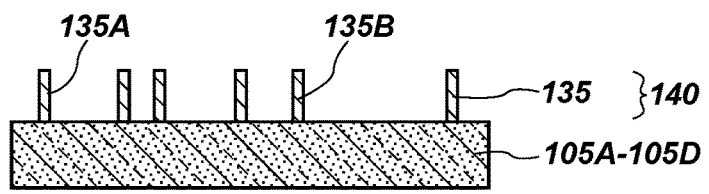
Figure 5B:
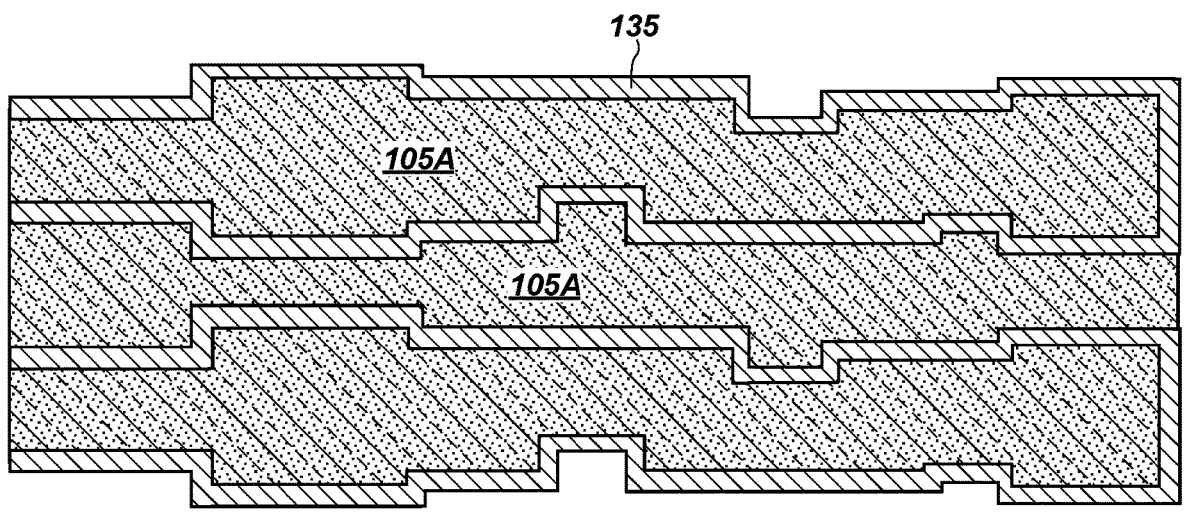

Horizontal portions of the first spacer material 130 over the top surface of the mandrels 100 and top surface of the hardmask material 105 are removed, forming first spacers 135 on the sidewalls (e.g., vertical sidewalls) of the mandrels 100, as shown in FIGS. 5A and 5B, which mandrels 100 are subsequently removed. The mandrels 100 are selectively etchable since the mandrel material and first spacer material 130 are selected to be selectively etchable relative to one another. Following removal of the mandrels 100, a first spacer pattern 140 including the first spacers 135 is present on the hardmask material 105 (e.g., on the first hardmask portion 105A). The first spacer pattern 140 includes first spacers 135A that are separated from one another by the width of the small mandrels 100A and first spacers 135B that are separated from one another by the width of the large mandrel 100B. The first spacers 135A, 135B have substantially the same width W3 (corresponding to the thickness at which the first spacer material 130 was formed) as one another and exhibit a pitch doubling relative to the pitch of the mandrels 100. However, the first spacers 135 may be separated from one another by variable (e.g., different) distances, depending on the width of the mandrels 100 that were removed.

Figure 6A:
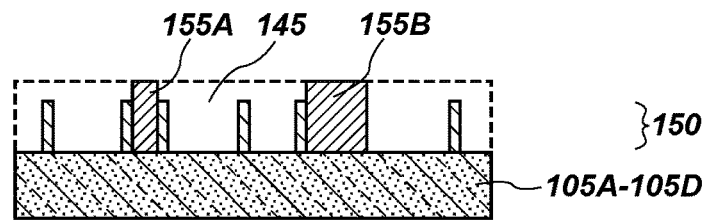
Figure 6B:
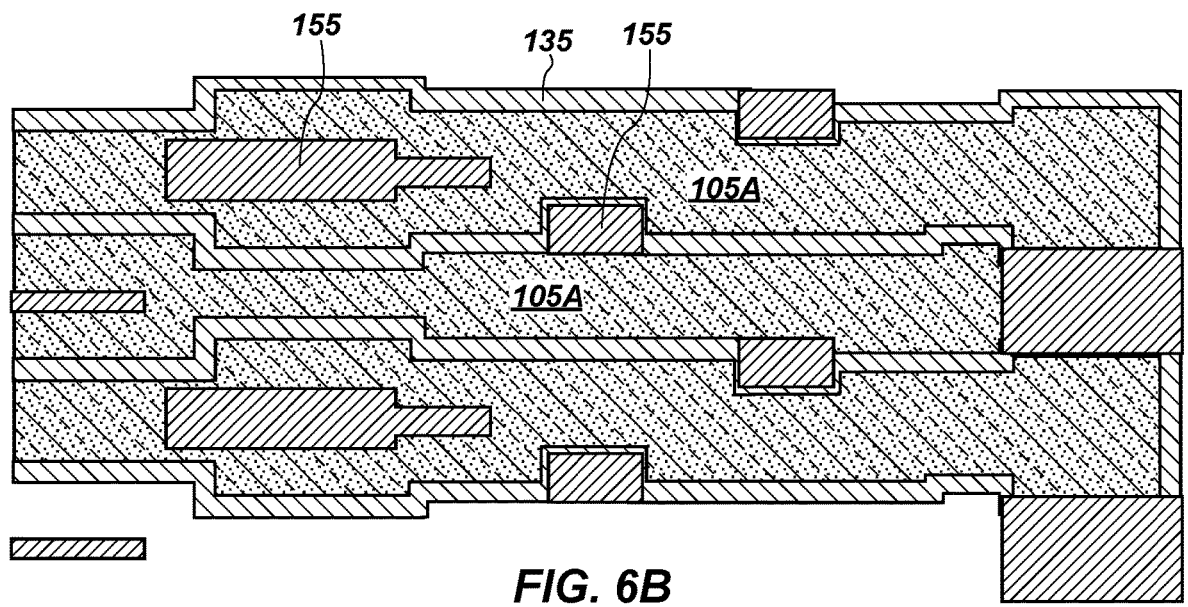

A second photolithography act is conducted to form second photoresist features that exhibit different sizes (i.e., widths) than the first spacers 135. A second photoresist material 145 (shown in dashed lines in FIG. 6A) is formed over the first spacers 135 (e.g., first spacers 135A, 135B) and over the top surface of the hardmask material 105, as shown in FIGS. 6A and 6B. The second photoresist material 145 is patterned (e.g., exposed and developed) to form a second photoresist pattern 150 including second photoresist features 155 and the first spacers 135. Portions of the second photoresist material 145 are removed by conventional techniques, exposing the first spacers 135 and top surface of the hardmask material 105 (i.e., a top surface of the first hardmask portion 105A), while other portions of the second photoresist material 145 remain between the first spacers 135 and form the second photoresist features 155. The second photoresist features 155, alone or in combination with contacting first spacers 135, substantially correspond in size to the spacing between the small metal segments that are ultimately to be formed.

The second photoresist features 155 may substantially completely span a distance between adjacent first spacers 135 or the second photoresist features 155 may be in contact with only one first spacer 135, depending on the metal pattern ultimately to be formed. As illustrated most clearly in FIG. 6B, some of the second photoresist features 155 may be in contact with some of the first spacers 135A, 135B, some of the second photoresist features 155 may be isolated (e.g., not in contact with) the first spacers 135A, 135B, and some of the first spacers 135A, 135B may not be in contact with the second photoresist features 155. The second photoresist features 155 may be substantially the same in size (e.g., width) as one another, or one or more of the second photoresist features 155 may be differently sized (e.g., width) than one another. However, the width of the second photoresist features 155 is larger than the width of the first spacers 135. For example, the width of the smallest of the second photoresist features 155 may be greater than the width of the largest of the first spacers 135. The second photoresist features 155 of the second photoresist pattern 150 may each have the same width as one another or one or more of the second photoresist features 155 may exhibit a different width. As discussed in more detail below, the second photoresist pattern 150 is used to form the small metal segments having different (e.g., unequal) spacings between the small metal segments.

Figure 7A:
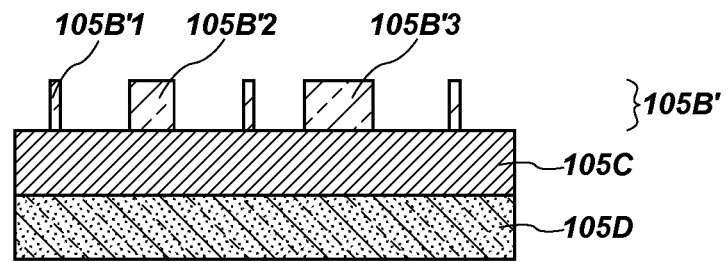
Figure 7B:
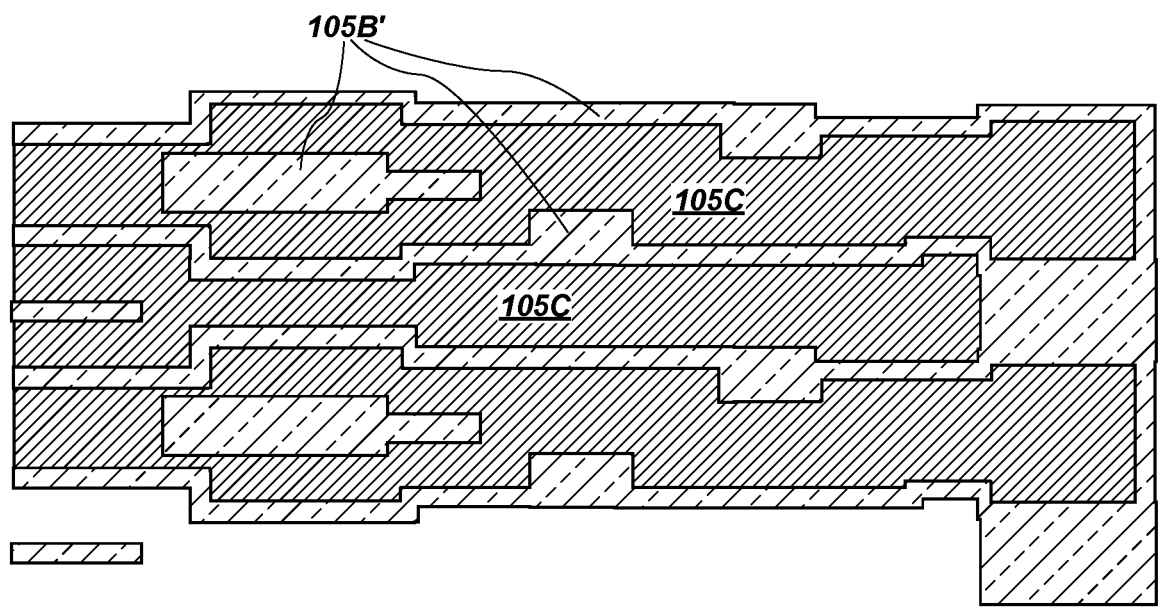

The combined pattern of the first spacers 135 and the second photoresist features 155 is transferred into the underlying hardmask material 105, such as into the second hardmask portion 105B, by conventional techniques and the first spacers 135 and the second photoresist features 155 are removed by conventional techniques. The combined pattern is first transferred into the first hardmask portion 105A (see FIG. 3), and patterned first hardmask portion is used as a mask to transfer the pattern of the first spacers 135 and the second photoresist features 155 into the second hardmask portion 105B, forming patterned second hardmask portion 105B' as shown in FIGS. 7A and 7B, and the patterned first hardmask portion is removed. Since the first spacers 135 and the second photoresist features 155 are of different sizes (e.g., widths), the patterned second hardmask portion 105B' includes second hardmask segments 105B'1-105B'3 that are of variable widths and are unevenly spaced from one another. As shown in FIG. 7A, the patterned second hardmask portion 105B' includes second hardmask segments 105B'1 that substantially correspond in size to the size of the first spacers 135A (see FIG. 6A), second hardmask segments 105B'2 that substantially correspond in size to the size of the two first spacers 135A in combination with the size of the second photoresist feature 155A (see FIG. 6A), and second hardmask segment 105B'3 that substantially corresponds in size (e.g., width) to the size (e.g., width) of one first spacer 135A in combination with the size of the second photoresist feature 155B (see FIG. 6A). By way of example only, the patterned second hardmask portion 105B' includes the second hardmask segments 105B'1-105B'3 of three different sizes. However, additional and variably sized (e.g., different widths) second hardmask segments 105B'1-105B'3 may be present by appropriately configuring the second photoresist pattern 150. By utilizing the patterned second hardmask portion 105B' including the second hardmask segments 105B'1-105B'3 of different widths, the small metal segments may be formed at different spacings. The second hardmask segments 105B'1-105B'3 of the patterned second hardmask portion 105B' are of variable widths and are unevenly spaced from one another.

Figure 8A:
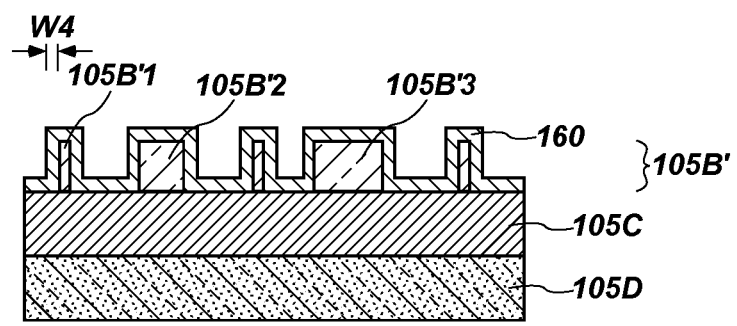
Figure 8B:
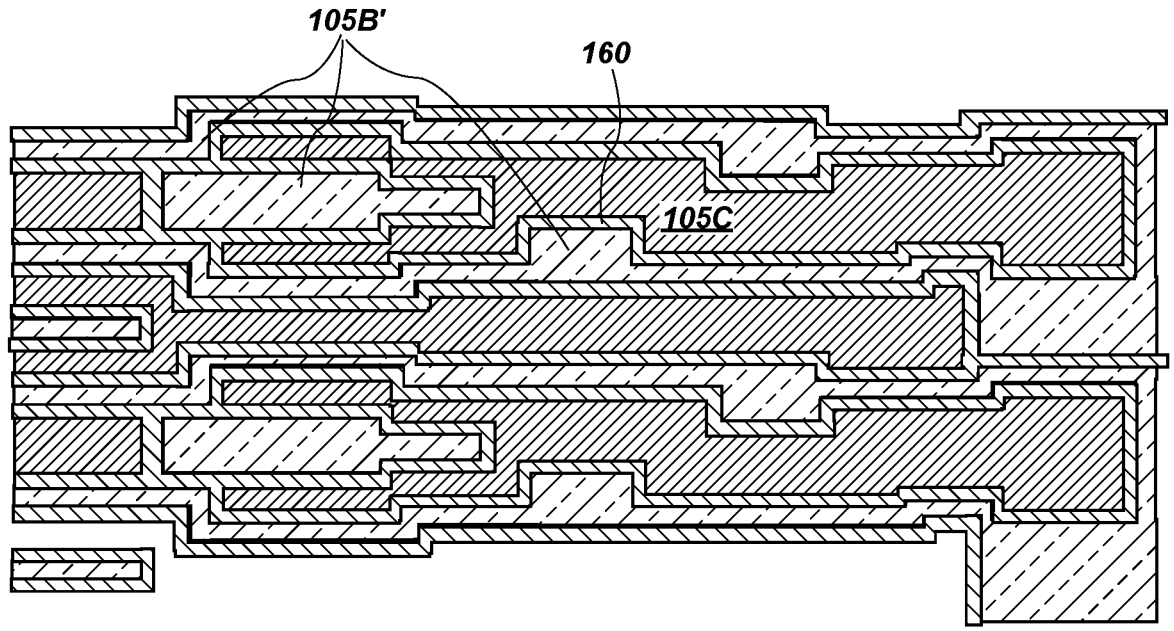

A second spacer material 160 is formed over the patterned second hardmask portion 105B', such as over sidewalls and a top surface of the patterned second hardmask portion 105B' and over a top surface of the third hardmask portion 105C, as shown in FIGS. 8A and 8B. The second spacer material 160 is formed at a thickness that corresponds to a desired width W4 of second spacers as described in detail below. The width W4 of the second spacer material 160 may be substantially the same as the width W3 of the first spacer material 130 or the thicknesses W3 and W4 may be different from one another. The second spacer material 160 may be one of the materials described above for the first spacer material 130 and may be formed by conventional techniques as described above. For example, the second spacer material 160 may be conformally formed over the patterned second hardmask portion 105B', such as by an ALD process. As shown most clearly in FIG. 8B, portions of the second spacer material 160 may come into contact with other portions of the second spacer material 160 depending on the spacing between the second spacer material 160 and the patterned second hardmask portion 105B'. The contacting portions of the second spacer material 160 may provide contact (e.g., interconnection) between the small and medium metal segments that are ultimately to be formed.

Figure 9:
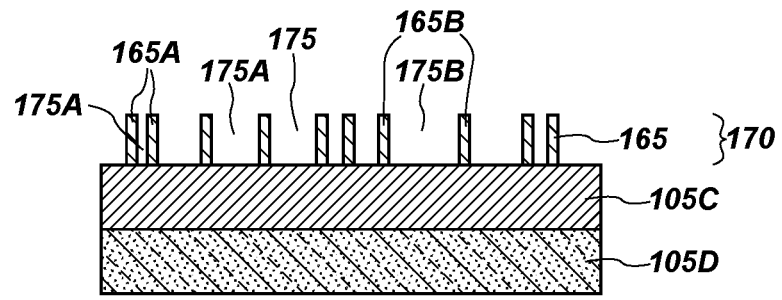
FIGS. 9 and 18 are cross-sectional views of the pattern during various stages of fabrication in accordance with embodiments of the disclosure.

Horizontal portions of the second spacer material 160 over the top surface of the patterned second hardmask portion 105B' and top surface of the third hardmask portion 105C are removed, forming second spacers 165 (see FIG. 9) on the sidewalls of the patterned second hardmask portion 105B'. The patterned second hardmask portion 105B' is removed, forming a second spacer pattern 170 of the second spacers 165 located on the third hardmask portion 105C, as shown in FIG. 9. The second spacer pattern 170 includes the second spacers 165 separated from one another by openings 175 that substantially correspond in width to the widths of the second hardmask segments 105B'1-105B'3 of the patterned second hardmask portion 105B'. Since the patterned second hardmask portion 105B' included the second hardmask segments 105B'1-105B'3 of different sizes, the second spacers 165 are separated from one another by variable distances. For example, second spacers 165A are separated from one another by smaller openings 175A and second spacers 165B are separated from one another by larger openings 175B. The second spacer pattern 170 includes the second spacers 165 formed at variable (e.g., different) spacings while the second spacers 165 are formed at the same critical dimension (CD). In other words, the second spacers 165 are unevenly spaced relative to one another. The second spacers 165 substantially correspond in size (e.g., width) to the small metal segments ultimately to be formed, with the second spacers 165A, 165B having variable spacings between adjacent second spacers 165. By utilizing the second spacers 165, the pitch has quadrupled relative to the initial pitch of the mandrels 100.

Figure 10A:
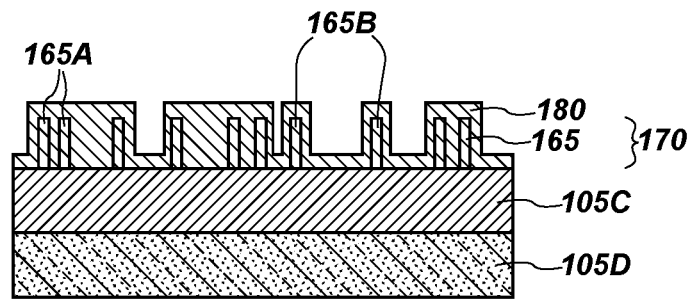
Figure 10B:
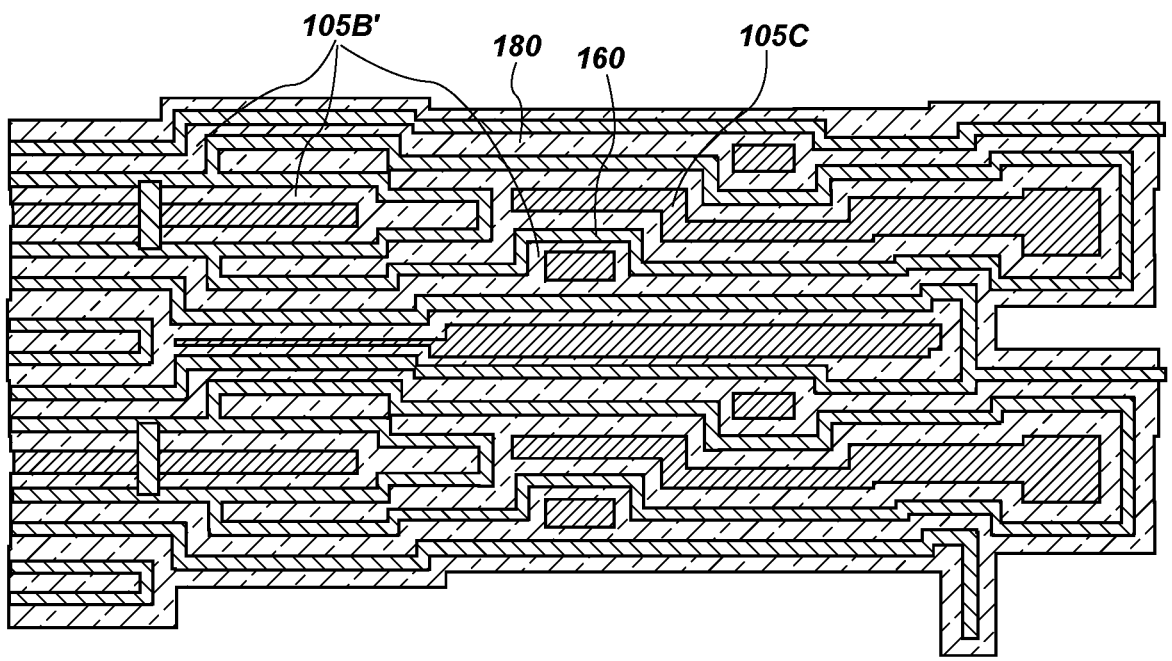

A third spacer material 180 is formed over the second spacers 165, such as over sidewalls and a top surface of the second spacers 165 and over a top surface of the third hardmask portion 105C, as shown in FIGS. 10A and 10B. The third spacer material 180 may be formed over the second spacers 165 by conventional techniques, substantially completely filling the smaller openings 175A between the second spacers 165 while the larger openings 175B between the second spacers 165 are not substantially completely filled with the third spacer material 180. Rather, the larger openings 175B are partially filled with the third spacer material 180. The third spacer material 180 may be one of the materials discussed above for the first spacers 135 or the second spacers 165, with the third spacer material 180 being selectively etchable relative to the underlying second spacers 165. The third spacer material 180 may be formed by conventional techniques including, but not limited to, CVD, ALD, self-assembly techniques such as grafter polymer brushes or block copolymers, etc.

Figure 11A:
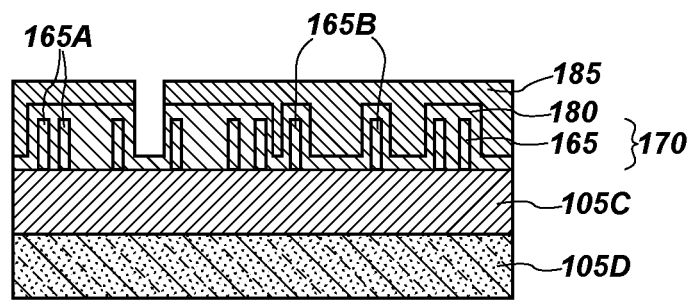
Figure 11B:
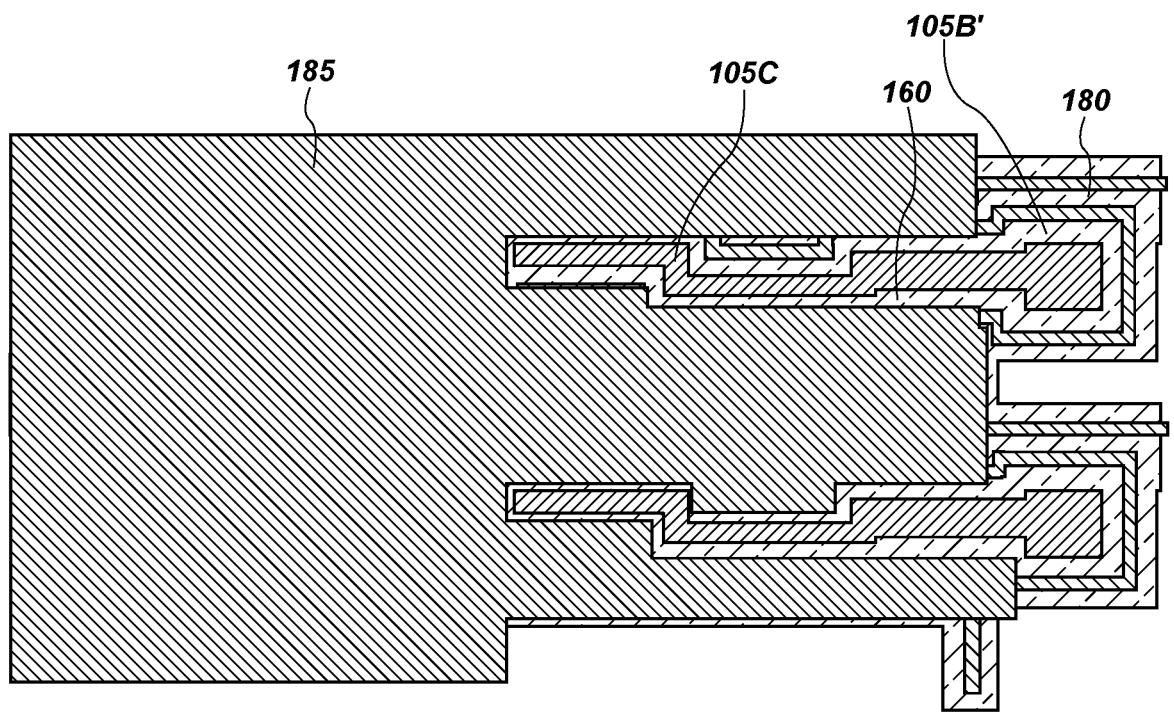

A third photoresist material is formed over the third spacer material 180 and patterned, as shown in FIGS. 11A and 11B. The third photoresist material may be one of the materials discussed above for the first photoresist material or the second photoresist material 145. The third photoresist material is patterned by conventional techniques to form a third photoresist pattern 185 over some portions of the third spacer material 180 but not over other portions of the third spacer material 180. As shown in FIG. 11A, the third photoresist material is formed over the third spacer material 180 overlying the smaller openings 175A while the third photoresist material is not formed over the third spacer material 180 overlying one of the larger openings 175B. Sidewalls of the third photoresist pattern 185 may be substantially aligned with sidewalls of the third spacer material 180, enabling a self-aligned trench in the third hardmask portion 105C to be subsequently formed. By way of example only, the third photoresist pattern 185 substantially covers a majority of the second and third spacer materials 160, 180, except for in locations where the medium metal segments are ultimately to be formed, such as proximal to the larger openings 175B. The larger openings 175B may include the third spacer material 180 formed therein. However, the third photoresist material may not be formed in the larger openings 175B.

Figure 12A:
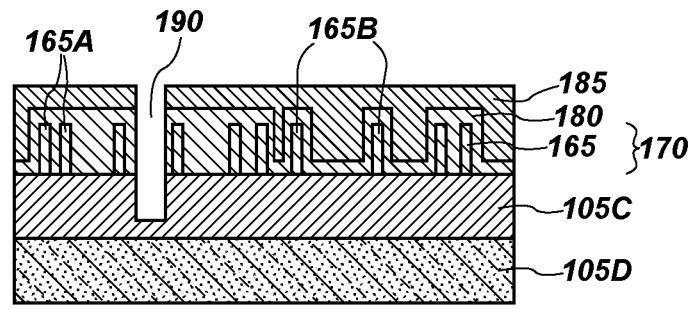
Figure 12B:
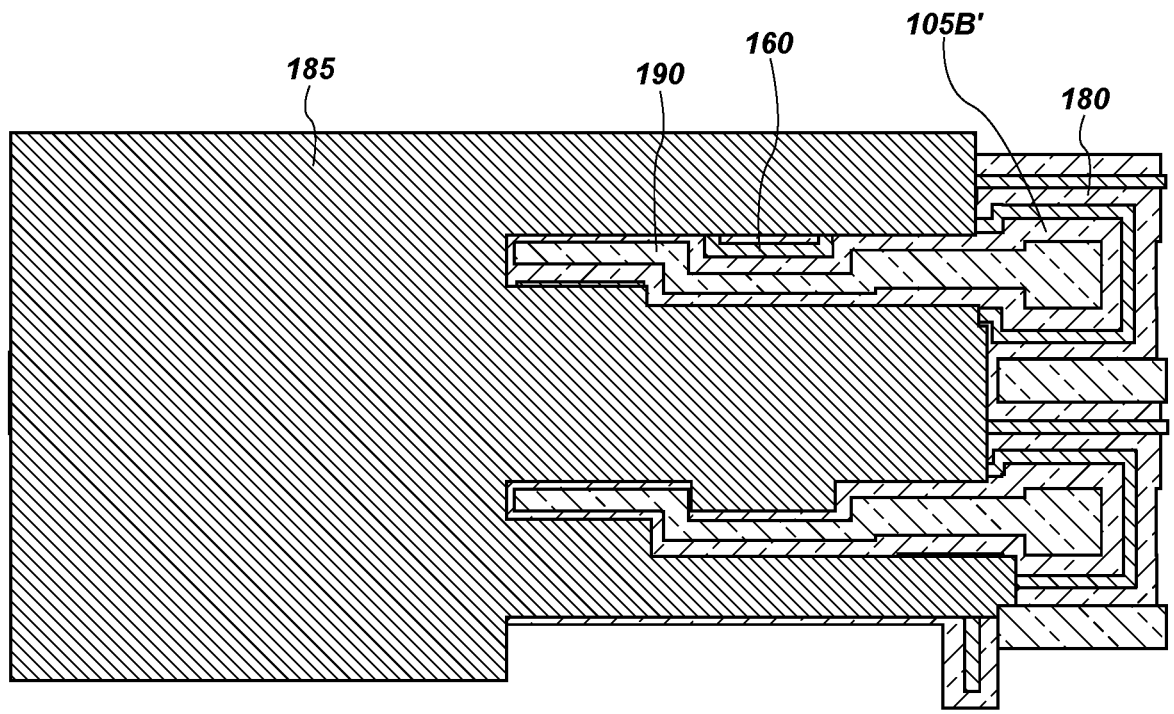
Figure 13A:
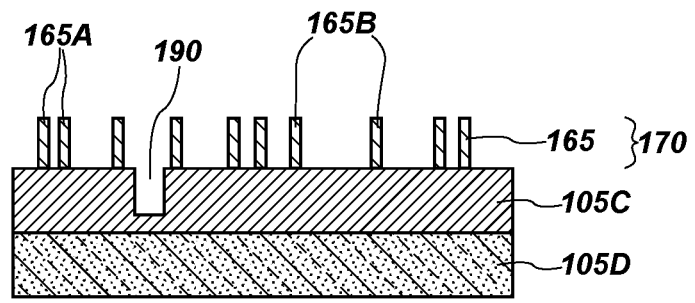
Figure 13B:
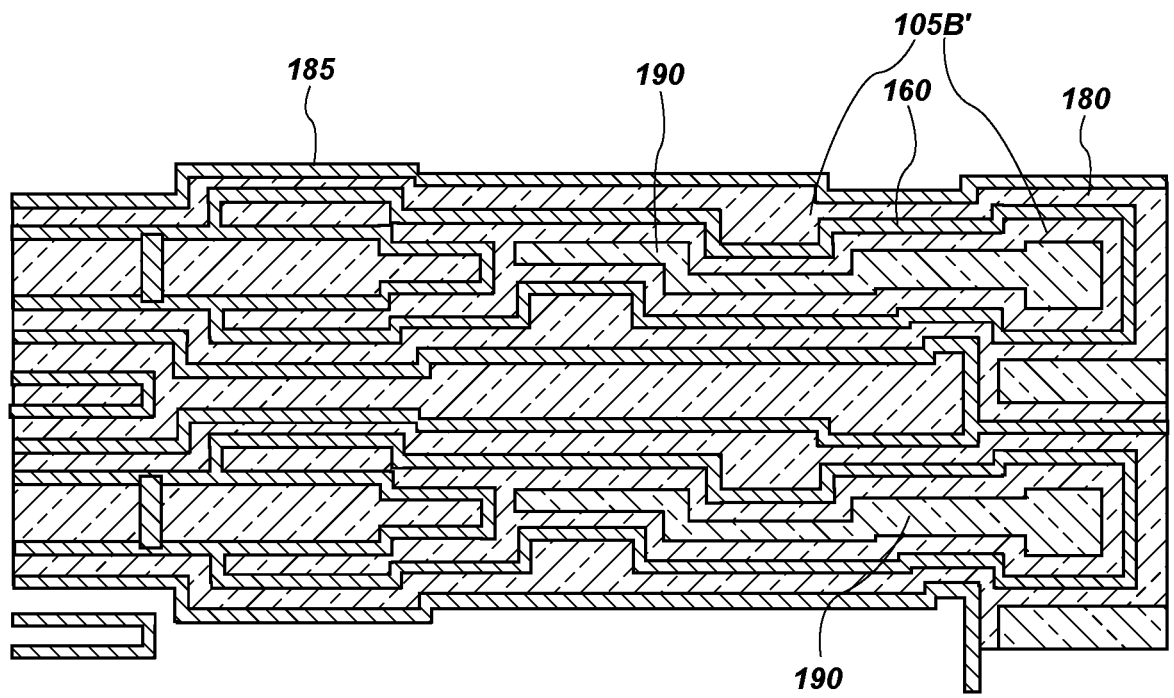

The third photoresist pattern 185 may be transferred into the third hardmask portion 105C, as shown in FIGS. 12A and 12B. Since the materials of the third spacer material 180, the second spacer material 160, and the third hardmask portion 105C are selectively etchable relative to the material of the third photoresist pattern 185, the third photoresist pattern 185 is transferred into the third hardmask portion 105C by appropriately selecting the etch chemistry and etch conditions. The third photoresist pattern 185 may, therefore, function as a so-called "chop mask" to form trench 190 in the third hardmask portion 105C that substantially corresponds in size (e.g., width) to the medium metal segments of the metal pattern ultimately to be formed. The trench 190 in the third hardmask portion 105C may be formed without removing portions of the third hardmask portion 105C covered by the third photoresist pattern 185. The third photoresist pattern 185 and the third spacer material 180 may then be removed, by conventional techniques, as shown in FIGS. 13A and 13B, such that the second spacer pattern 170 on the third hardmask portion 105C and the trench 190 (e.g., a self-aligned trench) are exposed. As described below, the second spacer pattern 170 enables forming openings in the third hardmask portion 105C that substantially correspond in size to the small metal segments of the metal pattern to be formed, and the trench 190 enables forming an opening in the third hardmask portion 105C that substantially corresponds in size to the medium metal segments of the metal pattern.

Figure 14A:
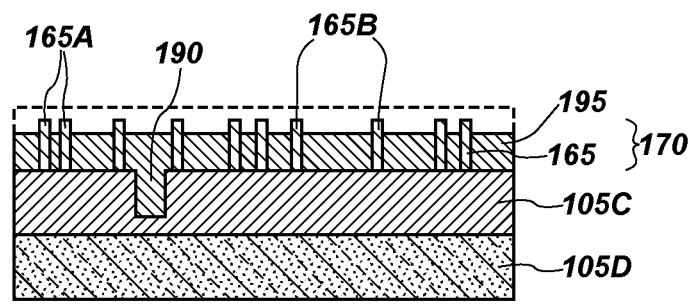
Figure 14B:
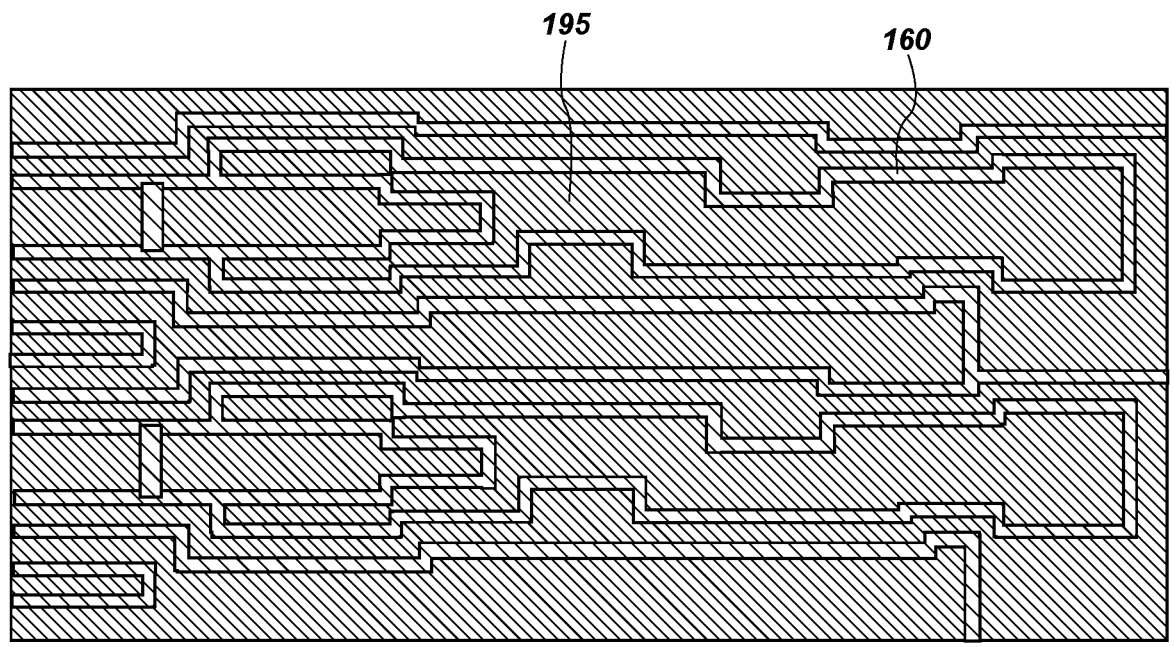

A planarizing material 195 (shown in dashed lines in FIG. 14A) may then be formed over the second spacer pattern 170 and in the trench 190, filling the trench 190 and covering the second spacer pattern 170. The planarizing material 195 may include, but is not limited to, a spin-on carbon material, a spin-on dielectric material (e.g., a spin-on silicon oxide), a spin-on metal oxide material, or other material, however formed, that forms a substantially planar top surface upon formation. The planarizing material 195 is formed by conventional techniques. A portion of the planarizing material 195 may be removed to expose the second spacer pattern 170, as shown in FIGS. 14A and 14B. Once exposed, the second spacer pattern 170 may be removed by conventional techniques, such as by a wet etch process or a dry etch process, and the resulting openings (not shown) in the planarizing material 195 may be used as a mask to pattern the third hardmask portion 105C. The openings (not shown) are adjacent (e.g., laterally adjacent) to the planarizing material 195.

Figure 15:
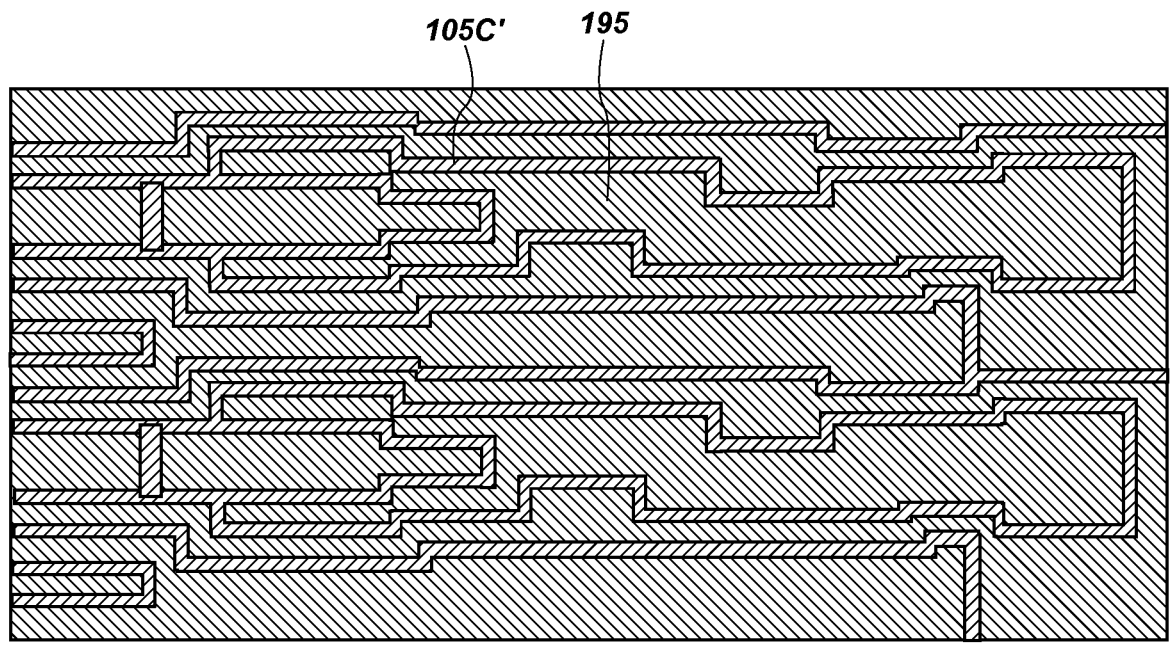
FIG. 15 is a top down view of the pattern during fabrication in accordance with embodiments of the disclosure.
Figure 16A:
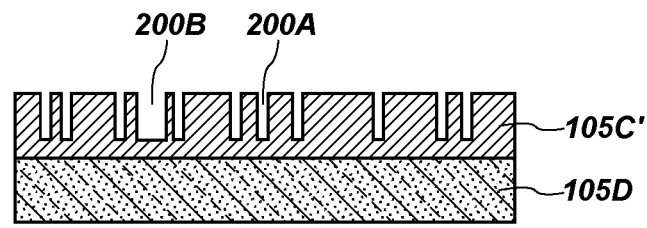
Figure 16B:
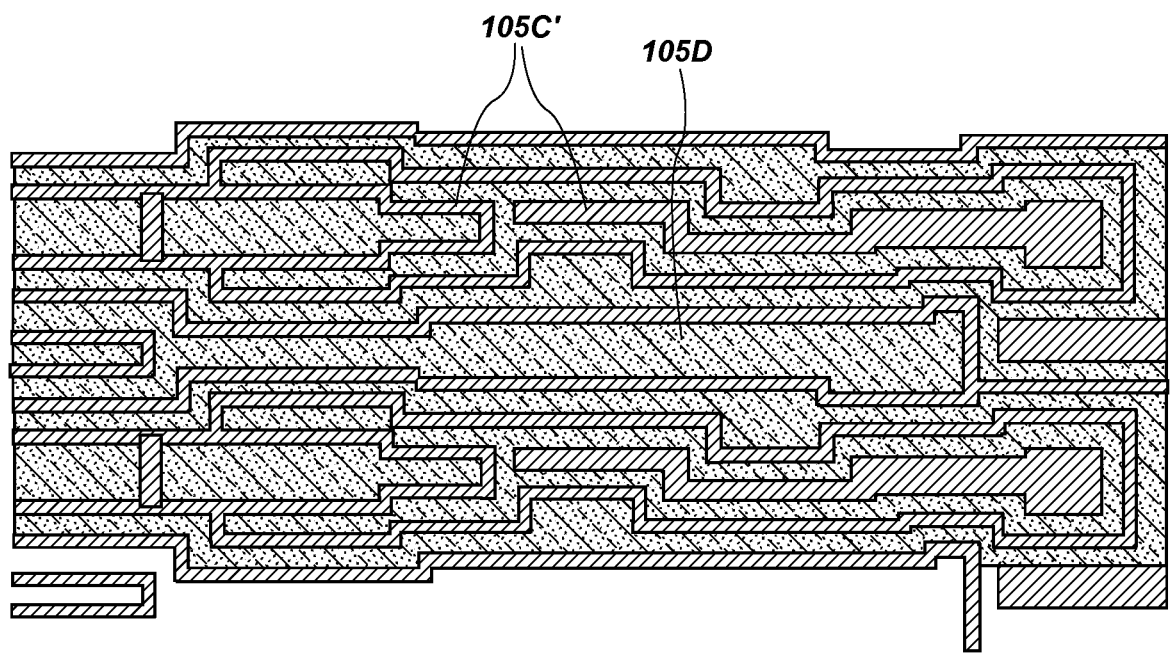

The openings in the planarizing material 195 may be used to conduct an image reversal of the second spacer pattern 170 in the third hardmask portion 105C, as shown in FIG. 15. After transferring a pattern of the openings into the third hardmask portion 105C, the second spacer pattern 170 is removed by conventional techniques, producing a pattern of openings in the planarizing material 195. The openings in the planarizing material 195 are formed in corresponding locations to the second spacer pattern 170 and in the trench 190. As shown in FIGS. 16A and 16B, the planarizing material 195 is removed, forming smaller openings 200A and medium openings 200B in patterned third hardmask portion 105C'. The medium openings 200B may vary in size from one another and exhibit a greater width than a width of the smaller openings 200A, which may also vary in size from one another. Thus, the patterned third hardmask portion 105C' includes the openings 200A, 200B of different sizes, with the openings 200A, 200B also being unevenly spaced from one another.

Figure 17A:
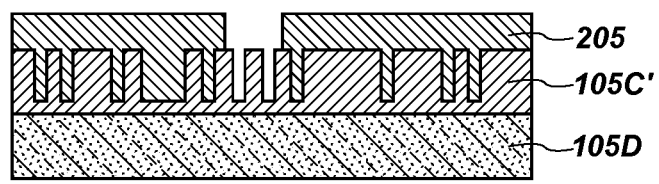
Figure 17B:
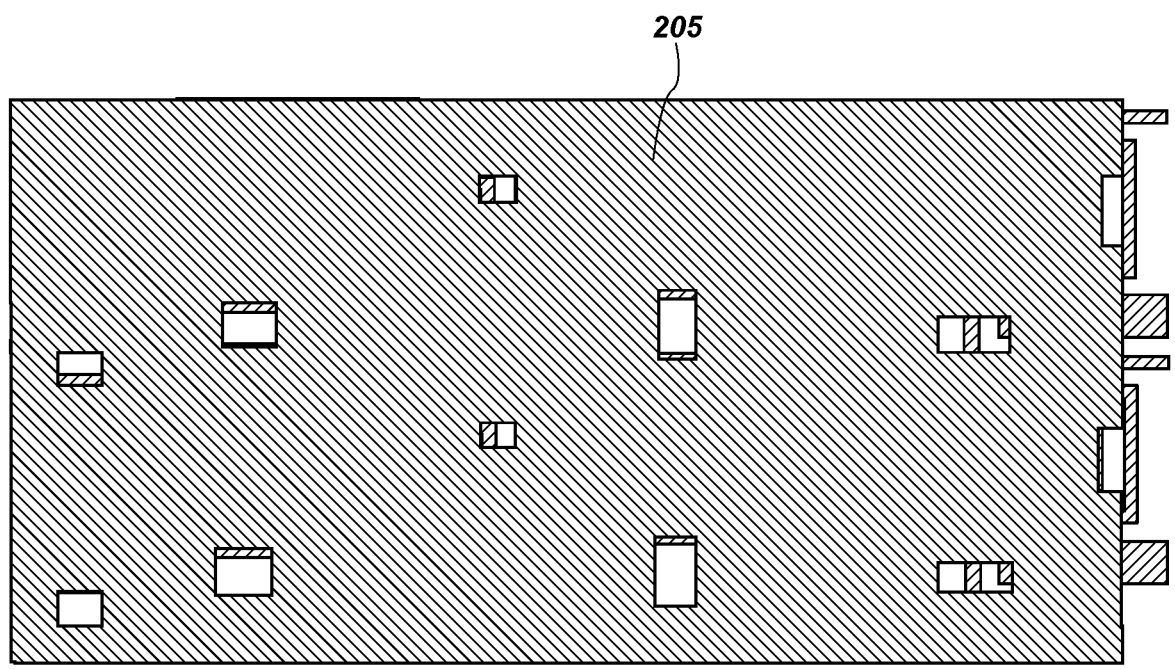
Figure 18:
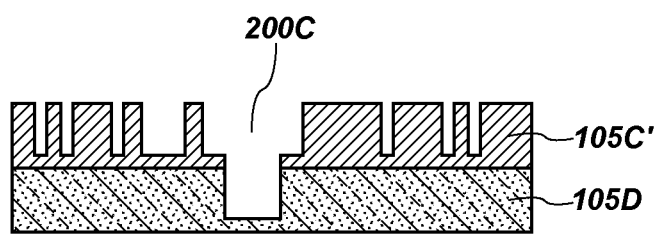
Figure 19A:
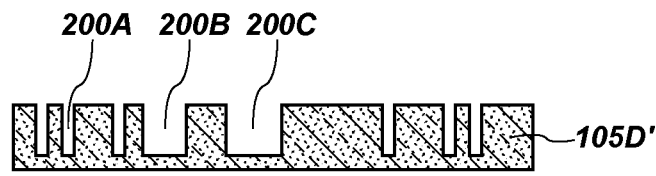
Figure 19B:
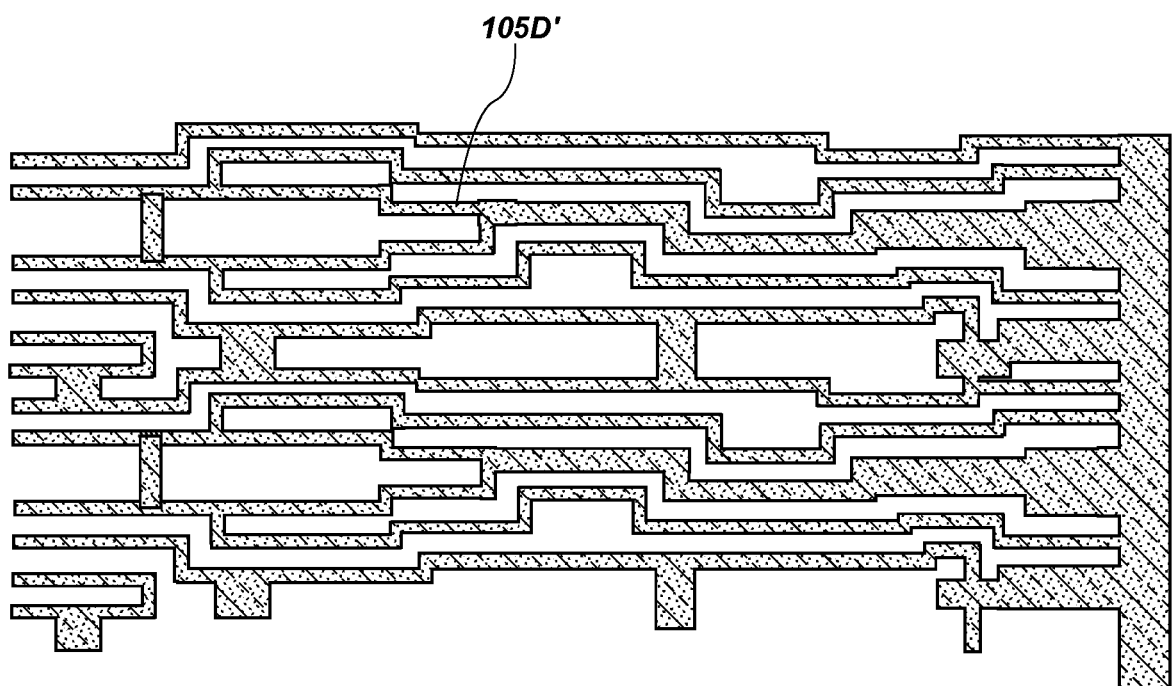

A fourth photoresist material is then formed over the patterned third hardmask portion 105C'. The fourth photoresist material may be one of the materials discussed above for the first photoresist material or the second photoresist material 145. The fourth photoresist material may be patterned by conventional techniques to form a fourth photoresist pattern 205 over some portions of the patterned third hardmask portion 105C', but not over other portions of the patterned third hardmask portion 105C', as shown in FIGS. 17A and 17B. The fourth photoresist pattern 205 may, subsequently, be used as a so-called "chop mask" to form larger openings 200C (see FIG. 18) in the patterned third hardmask portion 105C' without removing portions of the patterned third hardmask portion 105C' covered by the fourth photoresist pattern 205. The fourth photoresist pattern 205 may be transferred from the patterned third hardmask portion 105C' and into the fourth hardmask portion 105D, as shown in FIG. 18. The fourth photoresist pattern 205 may be removed and the pattern of the patterned third hardmask portion 105C' transferred into the fourth hardmask portion 105D, as shown in FIGS. 19A and 19B, forming patterned fourth hardmask portion 105D'.

Figure 20A:
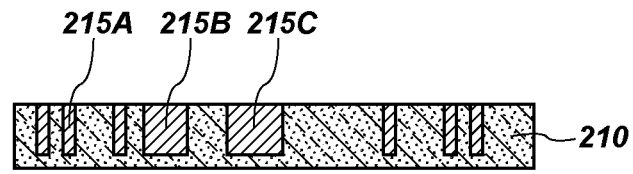
Figure 20B:
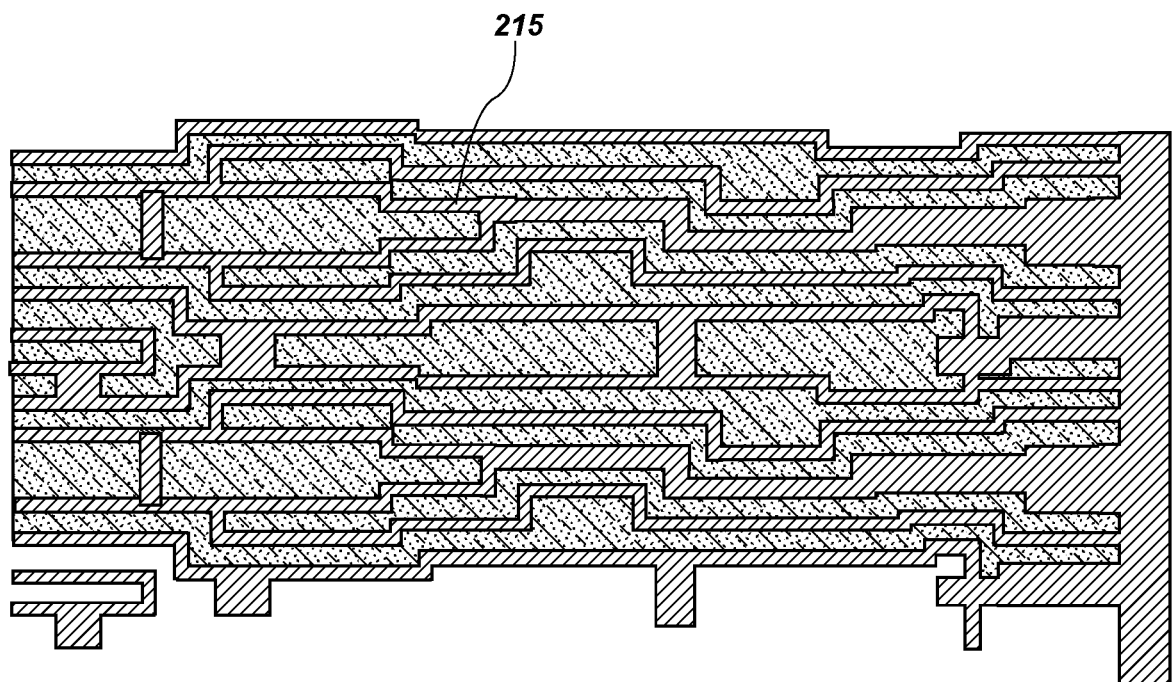

The openings 200A-200C in the patterned fourth hardmask portion 105D' may be transferred to an underlying material 210 (e.g., a substrate) and filled with a metal, to form metal pattern 215 (e.g., a complex metal pattern), as shown in FIGS. 20A and 20B, including small metal segments 215A, medium metal segments 215B, and large metal segments 215C. The metal may, for example, be tungsten, titanium, nickel, platinum, ruthenium, aluminum, copper, molybdenum, gold, an alloy thereof, or a combination thereof. The metal pattern 215 according to embodiments of the disclosure may include the small metal segments 215A, the medium metal segments 215B, and the large metal segments 215C, some of which are interconnected to form the metal pattern 215. In addition to having different sizes (e.g., widths), the small metal segments 215A, medium metal segments 215B, and large metal segments 215C may be separated from one another by variable spacing. The small metal segments 215A may be formed at a pitch of less than about 45 nm, such as less than about 40 nm. In some embodiments, the small metal segments are formed at a pitch of between about 23 nm and about 25 nm. While embodiments herein refer to metal patterns, patterns in other materials may also be formed.

Alternatively, the openings 200A-200C in the patterned fourth hardmask portion 105D' may be transferred into an underlying conductive material or an underlying semiconductive material, such as an underlying metal material (not shown), to form the metal pattern 215 including the small metal segments 215A, the medium metal segments 215B, and the large metal segments 215C. The metal may, for example, be tungsten, titanium, nickel, platinum, ruthenium, aluminum, copper, molybdenum, gold, an alloy thereof, or a combination thereof. While embodiments herein refer to metal patterns, patterns in other materials, such as polysilicon, may also be formed.

By forming and removing the mandrels 100, the first spacer pattern 140, the second spacer pattern 170, the third spacer material 180, the first photoresist pattern 110, the second photoresist pattern 150, the third photoresist pattern 185, the planarizing material 195, the fourth photoresist pattern 205, and the hardmask portions 105A-105C of the hardmask material 105 at different times and in different locations as described above, the patterned fourth hardmask portion 105D' having the variably sized and variably spaced openings 200A-200C is formed. The openings 200A-200C in the patterned fourth hardmask portion 105D' are filled with a metal or the openings 200A-200C are transferred into an underlying metal, forming the metal pattern 215. The formation of the metal pattern 215 according to embodiments of the disclosure utilizes a similar number of process acts or fewer process acts compared to conventional techniques. Therefore, the metal pattern 215 is formed by a simpler process and is less costly.

Accordingly, a conductive pattern comprising interconnected small conductive segments, medium conductive segments, and large conductive segments is disclosed. At least one of the small conductive segments comprises a pitch of less than about 45 nm and the small conductive segments, the medium conductive segments, and the large conductive segments are separated from one another by variable spacing.

While embodiments herein refer to metal patterns, patterns in other materials may also be formed.

Accordingly, a method of forming a pattern is disclosed. The method comprises forming a mandrel pattern over a hardmask material. The mandrel pattern comprises at least two mandrels comprising different widths. First spacers are formed on sidewalls of the at least two mandrels, and the at least two mandrels are removed to form a first spacer pattern. A first photoresist material is formed over the first spacer pattern and the first photoresist material is patterned to form a first photoresist pattern comprising first photoresist features and the first spacers over the hardmask material. The first photoresist pattern is transferred into a first portion of the hardmask material to form a patterned first portion of the hardmask material. The first photoresist features and the first spacers are removed and second spacers are formed on sidewalls of the patterned first portion of the hardmask material. The patterned first portion of the hardmask material is removed to form a second spacer pattern, and a third spacer material is formed over the second spacer pattern. A second photoresist material is formed over the third spacer material and the second photoresist material is patterned to form a second photoresist pattern aligned with sidewalls of the third spacer material. The second photoresist material is transferred into a second portion of the hardmask material and the second photoresist pattern and the third spacer material are removed. A planarizing material is formed over the second spacer pattern and the second spacer pattern removed to form a pattern of openings, the openings laterally adjacent the planarizing material. The pattern of openings is transferred into the second portion of the hardmask material to form a patterned second portion of the hardmask material comprising small openings and medium openings. A third photoresist material is formed over the patterned second portion of the hardmask material and the third photoresist material is patterned to form a third photoresist pattern. The third photoresist pattern is transferred into the patterned second portion of the hardmask material and into a third portion of the hardmask material to form large openings therein. The small openings and medium openings are transferred into the third portion of the hardmask material to form a patterned third portion of the hardmask material comprising the small openings, the medium openings, and the large openings. The small openings, the medium openings, and the large openings are transferred into an underlying material.

Figure 21:
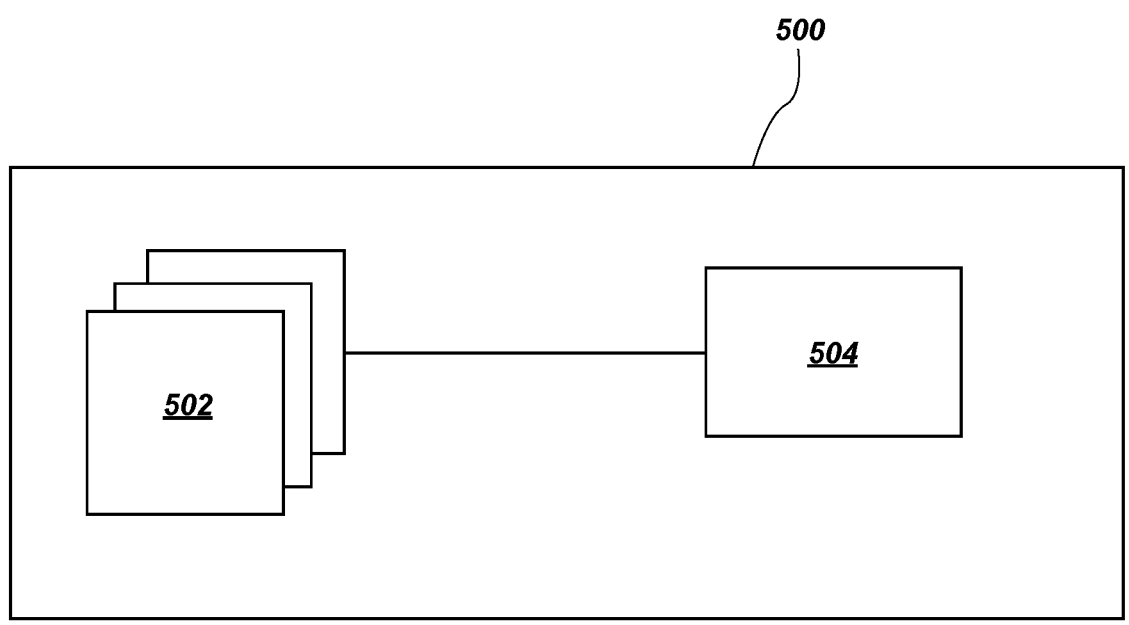
FIG. 21 is a schematic block diagram illustrating a semiconductor device comprising at least one metal pattern in accordance with embodiments of the disclosure.

The metal pattern 215 according to embodiments of the disclosure may be used as a first (e.g., initial, so-called "metal 0") metallization of a semiconductor device, such as a memory device. The metal pattern 215 may be used to provide local interconnections (e.g., routing) in the semiconductor device, with additional metal materials and other components formed above the metal pattern 215. The metal pattern 215 may be incorporated in memory structures, memory cells, arrays including the memory cells, memory devices, switching devices, other semiconductor devices including the arrays, and systems including the arrays. Embodiments of the metal pattern 215 may be used in a variety of different memory cells (e.g., volatile memory, non-volatile memory). Non-limiting examples include random-access memory (RAM), read only memory (ROM), dynamic random access memory (DRAM), synchronous dynamic random access memory (SDRAM), flash memory, resistive random access memory (ReRAM), conductive bridge random access memory (conductive bridge RAM), magnetoresistive random access memory (MRAM), phase change material (PCM) memory, phase change random access memory (PCRAM), spin-torque-transfer random access memory (STTRAM), oxygen vacancy-based memory, programmable conductor memory, ferroelectric random access memory (FE-RAM), reference field-effect transistors (RE-FET), etc. By way of example only, the metal pattern 215 may be incorporated into a DRAM device. As shown in FIG. 21, DRAM device 500 includes a memory array 502 and a control logic component 504. The memory array 502 includes memory cells including the metal pattern 215 as described above. The control logic component 504 may be operatively coupled with the memory array 502 so as to read, write, or re-fresh any or all memory cells within the memory array 502. Semiconductor devices including embodiments of the metal pattern 215 formed in accordance with embodiments of the disclosure may be formed by conducting additional process acts, which are not described in detail herein.

The metal pattern 215 according to embodiments of the disclosure may also be used in combination with one or more other metal patterns (e.g., metallizations), such as with one or more patterns of metal lines separated by spaces, with the metal lines equally spaced from one another. The metal pattern 215 according to embodiments of the disclosure may, for example, be combined with a redistribution layer (RDL) including metal lines equally spaced from one another.

Additional process acts may be conducted to form the semiconductor device including the metal pattern 215. The additional process acts may be conducted by conventional techniques, which are not described in detail herein.

Accordingly, a semiconductor device comprising an initial metallization and at least one additional metallization over the initial metallization is disclosed. The initial metallization comprises small metal segments, medium metal segments, and large metal segments. At least one of the small metal segments comprises a pitch of less than about 45 nm and at least one of the small metal segments, the medium metal segments, and the large metal segments are interconnected with one another.

Figure 22:
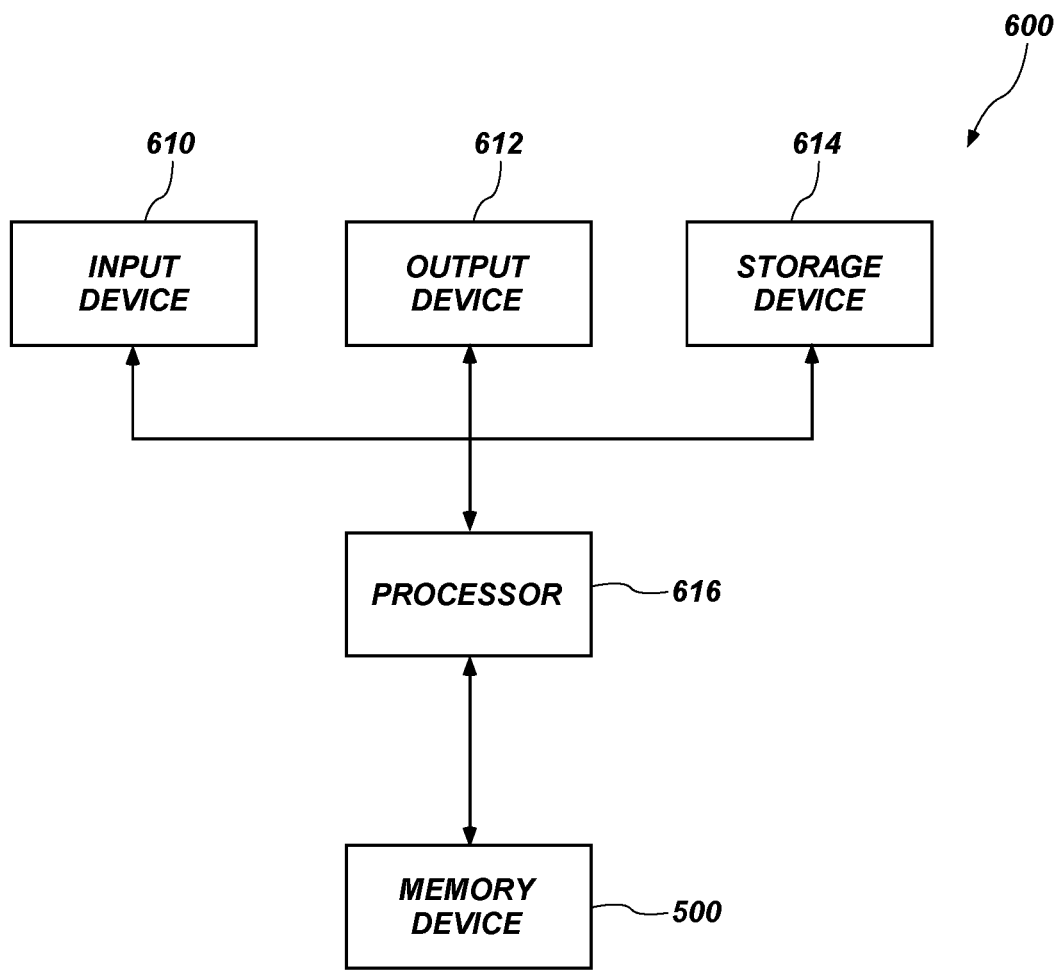
FIG. 22 is a schematic block diagram illustrating a system including semiconductor devices comprising at least one metal pattern in accordance with embodiments of the disclosure.

A system 600 is also disclosed, as shown in FIG. 22, and includes the memory array 502 of memory cells including the metal pattern 215 according to embodiments of the disclosure. FIG. 22 is a simplified block diagram of the system 600 implemented according to one or more embodiments described herein. The system 600 includes at least one input device 610. The input device 610 may be a keyboard, a mouse, or a touch screen. The system 600 further includes at least one output device 612. The output device 612 may be a monitor, touch screen, or speaker. The input device 610 and the output device 612 are not necessarily separate from, or separable from, one another. The system 600 further includes a storage device 614. The input device 610, output device 612, and storage device 614 are coupled to a processor 616. The system 600 further includes the DRAM device 500 coupled to the processor 616, with the DRAM device 500 including at least one metal pattern 215. The DRAM device 500 may include the memory array 502 of memory cells. In some embodiments, components of system 600, for example, processor 616 and DRAM device 500 may be implemented as a system on a chip (SoC). The system 600 may include a computing, processing, industrial, or consumer product. For example, without limitation, the system 600 may include a personal computer or computer hardware component, a server or other networking hardware component, a handheld device, a tablet computer, an electronic notebook, a camera, a phone, a music player, a wireless device, a display, a chip set, a game, a vehicle, or other known systems.

Accordingly, a system comprising a memory array comprising memory cells is disclosed. At least one of the memory cells comprises a conductive pattern comprising small conductive segments, medium conductive segments, and large conductive segments. At least one of the small conductive segments comprises a pitch of less than about 45 nm and the small conductive segments, the medium conductive segments, and the large conductive segments are interconnected with one another.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A semiconductor device, comprising:
   interconnected small conductive segments, medium conductive segments, and large conductive segments in a single patterned portion of a semiconductor device, at least one of the small conductive segments comprising a pitch of less than about 45 nm and the small conductive segments, the medium conductive segments, and the large conductive segments separated from one another by variable spacing,
   the small conductive segments exhibiting a first width, the medium conductive segments exhibiting a second width greater than the first width, and the large conductive segments exhibiting a third width greater than the second width.

2. The semiconductor device of claim 1, wherein the at least one of the small conductive segments comprises a pitch of less than about 40 nm.

3. The semiconductor device of claim 1, wherein the at least one of the small conductive segments comprises a pitch between about 20 nm and about 25 nm.

4. The semiconductor device of claim 1, wherein the at least one of the small conductive segments comprise a pitch between about 23 nm and about 25 nm.

5. The semiconductor device of claim 1, wherein a conductive material of the conductive pattern comprises tungsten, titanium, nickel, platinum, ruthenium, aluminum, copper, molybdenum, gold, an alloy thereof, or a combination thereof.

6. The semiconductor device of claim 1, wherein a conductive material of the conductive pattern comprises polysilicon.

7. A semiconductor device comprising:
   an initial metallization configured as local interconnections and comprising small metal segments, medium metal segments, and large metal segments, at least one of the small metal segments comprising a pitch of less than about 45 nm and at least some of the small metal segments, the medium metal segments, and the large metal segments interconnected with one another; and
   at least one additional metallization adjacent the initial metallization.

8. The semiconductor device of claim 7, wherein the at least one of the small metal segments comprises a pitch of less than about 40 nm.

9. The semiconductor device of claim 7, wherein the at least one of the small metal segments comprises a pitch of between about 20 nm and about 25 nm.

10. The semiconductor device of claim 7, wherein the small metal segments, the medium metal segments, and the large metal segments are separated from one another by unequally spaced distances.

11. The semiconductor device of claim 7, wherein the small metal segments, the medium metal segments, and the large metal segments comprise different widths.

12. The semiconductor device of claim 7, further comprising a redistribution layer.

13. The semiconductor device of claim 12, wherein the redistribution layer comprises metal lines equally spaced from one another.

14. A semiconductor device, comprising:
   an initial conductive pattern comprising small conductive segments, medium conductive segments, and large conductive segments, at least one of the small conductive segments comprising a pitch of less than about 45 nm at least some of the small conductive segments, the medium conductive segments, and the large conductive segments interconnected with one another, and the small conductive segments exhibiting one or more first widths, the medium conductive segments exhibiting one or more second widths greater than the first widths, and the large conductive segments exhibiting one or more third widths greater than the second widths; and at least one additional conductive pattern over the initial conductive pattern.

15. The semiconductor device of claim 14, further comprising an additional material over the initial conductive pattern.

16. A system comprising:
a memory array comprising memory cells, at least one of the memory cells comprising a conductive pattern comprising small conductive segments, medium conductive segments, and large conductive segments, at least one of the small conductive segments comprising a pitch of less than about 45 nm and at least some of the small conductive segments, the medium conductive segments, and the large conductive segments interconnected with one another in a single pattern; and
at least one input device, at least one output device, a storage device, and a processor in operative communication with the memory array.

17. The system of claim 16, wherein the small conductive segments, the medium conductive segments, and the large conductive segments are configured as an initial metallization of at least one of the memory cells.

18. The system of claim 16, wherein the small conductive segments, the medium conductive segments, and the large conductive segments are unequally spaced from one another.

* * * * *